United States Patent
Toyota

(10) Patent No.: US 9,748,194 B2
(45) Date of Patent: Aug. 29, 2017

(54) ELECTRONIC DEVICE

(71) Applicant: Murata Manufacturing Co., Ltd., Nagaokakyo-shi, Kyoto-fu (JP)

(72) Inventor: Yuji Toyota, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/290,131

(22) Filed: Oct. 11, 2016

(65) Prior Publication Data

US 2017/0141066 A1   May 18, 2017

(30) Foreign Application Priority Data

Nov. 18, 2015   (JP) .................................. 2015-225716

(51) Int. Cl.
| | |
|---|---|
| *H01L 23/48* | (2006.01) |
| *H01L 23/00* | (2006.01) |
| *H01L 23/31* | (2006.01) |
| *H01L 23/29* | (2006.01) |
| *H01L 21/60* | (2006.01) |

(52) U.S. Cl.
CPC .............. *H01L 24/17* (2013.01); *H01L 23/29* (2013.01); *H01L 23/31* (2013.01); *H01L 23/3107* (2013.01); *H01L 2021/60022* (2013.01); *H01L 2224/1703* (2013.01); *H01L 2224/175* (2013.01); *H01L 2924/141* (2013.01); *H01L 2924/142* (2013.01)

(58) Field of Classification Search
CPC   H01L 24/17; H01L 2021/60022; H01L 23/31
USPC ........................................................ 257/777
See application file for complete search history.

(56) References Cited

U.S. PATENT DOCUMENTS 8,669,174 B2 *   3/2014   Wu ..................... H01L 21/6835
                                                          438/108
9,589,941 B1 *   3/2017   Chen ..................... H01L 25/105

FOREIGN PATENT DOCUMENTS

JP         2001-257236 A         9/2001

* cited by examiner

*Primary Examiner* — David Vu
*Assistant Examiner* — Brandon Fox
(74) *Attorney, Agent, or Firm* — Keating & Bennett, LLP

(57) ABSTRACT

An electronic device includes a mount board, first and second electronic components flip-chip mounted on a surface of the mount board with bumps interposed therebetween, and a sealing member that seals the first and second electronic components on the mount board. A thickness of the first electronic component is larger than a thickness of the second electronic component, and a height of the bump bonded to the first electronic component is smaller than a height of the bump bonded to the second electronic component.

18 Claims, 9 Drawing Sheets

ELECTRONIC DEVICE

CROSS REFERENCE TO RELATED APPLICATIONS

This application claims the benefit of priority to Japanese Patent Application 2015-225716 filed on Nov. 18, 2015. The entire contents of this application are hereby incorporated herein by reference.

BACKGROUND OF THE INVENTION

1. Field of the Invention

The present invention relates to an electronic device including a plurality of flip-chip mounted electronic components.

2. Description of the Related Art

Flip-chip mounting is an example of a mounting method for decreasing the size and height of an electronic device including a plurality of functional elements and electronic components.

FIG. 9 is a cross-sectional view of an electronic device disclosed in Japanese Unexamined Patent Application Publication No. 2001-257236. FIG. 9 discloses an electronic device including two flip-chip mounted surface acoustic wave elements arranged in a single package form. The electronic device shown in FIG. 9 is a surface-mounted dual filter including a substantially cavity-shaped package 601, a cap plate 602, and two surface acoustic wave elements 611 and 612 mounted by flip-chip bonding. Spaces 641 and 642, in which interdigital transducer (IDT) electrodes 632 configuring the surface acoustic wave elements 611 and 612 are arranged, are provided by bumps 621 and 622. The package 601 and the cap plate 602 are bonded to each other by a brazing material 603 made of solder with a high-melting point, and hence the inside of the package 601 is hermetically sealed.

A method of decreasing the size of a flip-chip mounted electronic device may be decreasing the distance between two electronic components. However, if the distance between the two electronic components to be mounted is decreased, when the second electronic component is mounted, for example, the mounting tool may interfere with the mounted first electronic component, and the first electronic component may be physically damaged, possibly degrading characteristics and reliability. Owing to this, Japanese Unexamined Patent Application Publication No. 2001-257236 suggests a method of preventing interference with the mounting tool by setting the thickness of the surface acoustic wave element 611, which is mounted later, to be larger than the surface acoustic wave element 612, which is mounted first. To be specific, a thickness $tx_1$ of the surface acoustic wave element 611 is larger than a thickness $tx_2$ of the surface acoustic wave element 612, and the height of the bump 622 bonded to the surface acoustic wave element 612 is equivalent to the height of the bump 621 bonded to the surface acoustic wave element 611. Hence, a step is generated between the upper surfaces of the two surface acoustic wave elements 611 and 612 by the difference between the thicknesses of the two surface acoustic wave elements 611 and 612.

However, if a difference in thickness is provided among a plurality of electronic components, such as the electronic device disclosed in Japanese Unexamined Patent Application Publication No. 2001-257236, when the plurality of electronic components are sealed with a sealing member such as resin in a later step, an inclination is generated at the upper surface at the sealing member side of the sealed electronic device. If the inclination at the upper surface is large, the following problems may occur in manufacturing mounting steps. For example, (1) in a dicing step (a cutting step with a dicing machine) after sealing, a defective product may be generated due to non-uniform cutting, (2) when the electronic device is picked up using the upper surface by sucking etc., the upper surface cannot be picked up, and (3) a mark stamped on the upper surface cannot be recognized.

SUMMARY OF THE INVENTION

Accordingly, preferred embodiments of the present invention provide chip-scale packaging (CSP) electronic devices with good surface flatness.

According to a preferred embodiment of the present invention, an electronic device includes a mount board; a first electronic component and a second electronic component flip-chip mounted on a surface of the mount board with bumps interposed therebetween; and a sealing member that seals the first electronic component and the second electronic component on the mount board. A thickness of the first electronic component is larger than a thickness of the second electronic component, and a height of the bump bonded to the first electronic component is smaller than a height of the bump bonded to the second electronic component.

With this configuration, the height of the bump of the second electronic component with the small thickness is larger than the height of the bump of the first electronic component, and hence the difference between the mount height of the second electronic component and the mount height of the first electronic component is able to be smaller than the difference in thickness between the two electronic components. In other words, the volume of the sealing space above the second electronic component is able to be smaller, and hence, the difference in volume between that sealing space and the sealing space above the first electronic component is able to be decreased. Accordingly, since the inclination of the upper surface at the sealing member side of the electronic device is able to be decreased and the flatness is able to be improved, a CSP product that avoids a defective product in the dicing step (the cutting step with the dicing machine) after sealing, a failure in picking up a product using the upper surface, and a failure in recognizing a mark stamped on the upper surface are decreased, is able to be manufactured.

Also, in plan view of the mount board, an area of one electronic component of the first electronic component and the second electronic component with a large height from the surface of the mount board may be larger than an area of the other electronic component with a small height from the surface of the mount board.

With this configuration, the flat area of the upper surface of the sealing member above the electronic component with the large mount height is able to be increased. Accuracy of stamping a mark on the upper surface of the sealing member after sealing, and accuracy of recognizing the stamped mark is able to be increased. Accordingly, the manufacturing steps of the electronic device are simplified and the yield is increased.

Also, a length, in an arrangement direction in which the first electronic component and the second electronic component are arranged, of one electronic component of the first electronic component and the second electronic component with a small height from the surface of the mount board may be larger than a length in the arrangement direction of the other electronic component with a large height from the surface of the mount board.

With this configuration, the inclination generated between the upper surface of the sealing member above the first electronic component and the upper surface of the sealing member above the second electronic component is able to be decreased. The bonding area when a dicing sheet and the upper surface of the sealing member are bonded in the dicing step (the cutting step with the dicing machine) after sealing is able to be further increased, and hence cutting accuracy is increased. Accordingly, the manufacturing steps of the electronic device are simplified and the yield is increased.

Also, in the plan view of the mount board, a length, in an arrangement direction in which the first electronic component and the second electronic component are arranged, of one electronic component of the first electronic component and the second electronic component with a small height from the surface of the mount board may be larger than a length in a direction intersecting with the arrangement direction of the one electronic component with the small height from the surface of the mount board.

With this configuration, the inclination generated between the upper surface of the sealing member above the first electronic component and the upper surface of the sealing member above the second electronic component is able to be further decreased. Accordingly, the manufacturing steps of the electronic device are simplified and the yield is increased.

Also, a height of the first electronic component from the surface may be aligned with a height of the second electronic component from the surface.

With this configuration, the upper surface of the sealing member of the electronic device is able to be flat. A defective product in the dicing step (the cutting step with the dicing machine) after sealing, a failure in picking up a product using the upper surface of the sealing member, and a failure in stamping a mark on the upper surface of the sealing member is able to be further decreased.

Also, the bump bonded to the first electronic component and the bump bonded to the second electronic component may be made of the same material.

With this configuration, as compared with a case where different materials are used for the bumps, the difference in height between the bumps is able to be controlled in a simple step.

Also, the first electronic component may be an elastic wave element, and the second electronic component may be an amplifier element, for example.

With this configuration, a small-size and small-height high-frequency active device manufactured in simplified manufacturing steps is able to be provided, and, for example, a small-size and small-height CSP transmission-side module or reception-side module is able to be provided.

Also, the first electronic component and the second electronic component may be surface acoustic wave elements, for example.

With this configuration, a small-size and small-height complex SAW device manufactured in simplified manufacturing steps is able to be provided, and, for example, a small-size and small-height CSP SAW duplexer or dual filter is able to be provided.

With the preferred embodiments of the present invention, CSP electronic devices with improved and excellent surface flatness is able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
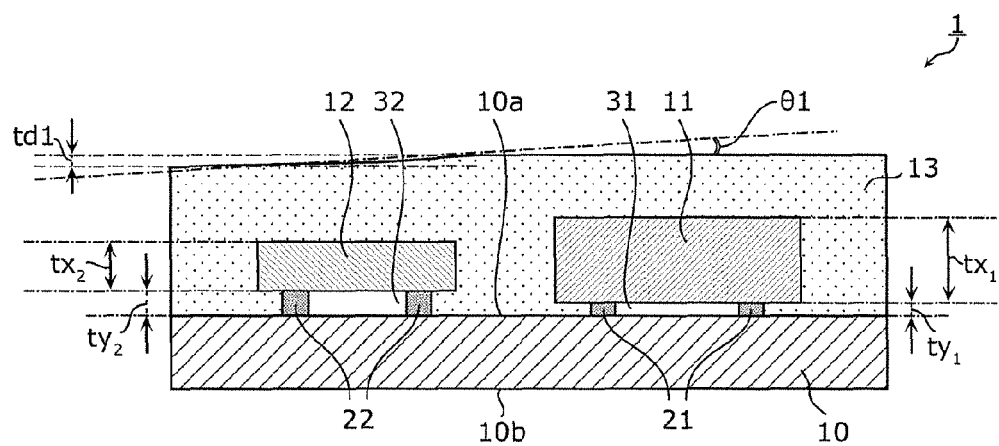
FIG. 1A is a cross-sectional view of an electronic device according to a first preferred embodiment of the present invention.

Preferred embodiments of the present invention are described below in detail with reference to the drawings. The preferred embodiments described below each represent a comprehensive or specific example. The numerical values, shapes, materials, components, arrangement of components, coupling forms, manufacturing steps, and order of manufacturing steps described in the following preferred embodiments are merely examples, and do not limit the present invention. Components not described in the independent claim among the components in the following preferred embodiments are described as arbitrary components. Also, the sizes or the ratio of sizes of the components illustrated in the drawings are not necessarily strict.

First Preferred Embodiment

FIG. 1A is a cross-sectional view of an electronic device 1 according to a first preferred embodiment of the present invention. The electronic device 1 illustrated in FIG. 1A includes a mount board 10, electronic components 11 and 12, bumps 21 and 22, and a sealing member 13.

The mount board 10 is a board on which the electronic components 11 and 12 are mounted, and is, for example, a printed board or a ceramic substrate. The mount board 10 includes one principal surface 10a and the other principal surface 10b. Land electrodes and wiring (not shown) are provided on at least the principal surface 10a. The land electrodes and wiring provided on the principal surface 10a are electrically coupled with inner wiring of the mount board 10 or an outer coupling electrode and outer wiring (not shown) provided on the principal surface 10b through a via conductor (not shown) or the like. The outer coupling electrode and outer wiring provided on the principal surface 10b have a structural arrangement that is able to be electrically coupled with an external circuit component.

The electronic component 11 is a first electronic component flip-chip mounted (flip-chip bonded) to the land electrode on the principal surface 10a of the mount board 10 with the bump 21 interposed therebetween. Also, the electronic component 12 is a second electronic component flip-chip mounted to the land electrode on the principal surface 10a with the bump 22 interposed therebetween.

The sealing member 13 is arranged around the electronic components 11 and 12. The electronic components 11 and 12 each are in close contact with the sealing member 13, and are covered with the sealing member 13. Accordingly, a hollow of the electronic component 11 and a hollow 32 of the electronic component 12 are hermetically sealed.

The electronic components 11 and 12 each are, for example, a high-frequency filter element, a high-frequency amplifier element, etc. Examples of the high-frequency filter element may be a surface acoustic wave filter, a boundary acoustic wave filter, an elastic wave filter using a bulk acoustic wave (BAW), and an LC filter including an inductance element and a capacitor element. Also, examples of the high-frequency amplifier element may be a low noise amplifier (LNA) element and a power amplifier (PA) element.

The sealing member 13 may be, for example, resin such as an epoxy resin. The epoxy resin may include a thermosetting epoxy resin including an inorganic filler such as $SiO_2$.

The bumps 21 and 22 are substantially ball-shaped electrodes configured of highly conductive metal, and may be, for example, electrodes containing Au as a main component. The bumps 21 and 22 are bonded to the electrodes of the electronic components 11 and 12. A plurality of the bumps 21 and a plurality of the bumps 22 are respectively bonded to the electronic components 11 and 12 in accordance with input and output terminals, GND terminals, bonding intensity balance, and so forth, of the electronic components 11 and 12. Then, the electronic components 11 and 12 are flip-chip mounted so that the plurality of bumps 21 and the plurality of bumps 22 are bonded to the corresponding land electrodes of the mount board 10.

In the electronic device 1 according to this preferred embodiment, a thickness $tx_1$ of the electronic component 11 is larger than a thickness $tx_2$ of the electronic component 12, and a height $ty_1$ of the bump 21 bonded to the electronic component 11 is smaller than a height $ty_2$ of the bump 22 bonded to the electronic component 12.

The thicknesses of the electronic components 11 and 12 are thicknesses of the electronic components 11 and 12 in the direction of the normal to the principal surface 10a, and are defined as distances from the bottom surfaces to the upper surfaces of the electronic components excluding the bumps in the normal direction. Also, if the bottom surfaces are not parallel to the upper surfaces, the thicknesses of the electronic components 11 and 12 are defined as the maximum distances from the bottom surfaces to the upper surfaces. Also, the height of the bumps 21 bonded to the electronic component 11 and the height of the bumps 22 bonded to the electronic component 12 are respectively the height in the normal direction of the bumps 21 bonded to the electronic component 11 and the height in the normal direction of the bumps 22 bonded to the electronic component 12.

Hereinafter, the thickness of an electronic component is defined as the thickness of the electronic component in the direction of the normal to a principal surface (or an element mount surface) of a board, and the height of a bump is defined as the height of the bump in the normal direction.

Figure 1B:
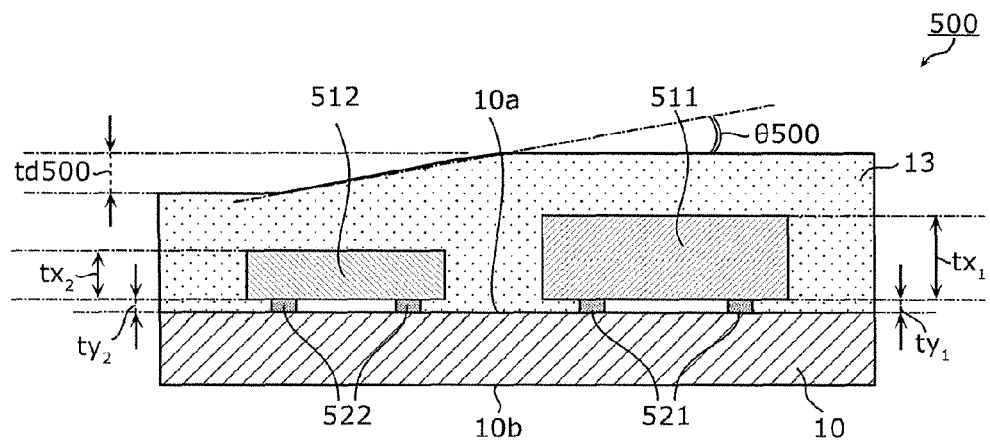
FIG. 1B is a cross-sectional view of an electronic device according to a comparative example.

FIG. 1B is a cross-sectional view of an electronic device 500 according to a comparative example. The electronic device 500 illustrated in FIG. 1B includes a mount board 10, electronic components 511 and 512, bumps 521 and 522, and a sealing member 13. The electronic device 500 according to this comparative example differs from the electronic device 1 according to the first preferred embodiment in that the electronic components 511 and 512 have different thicknesses; however, the bumps 521 and 522 have the same height.

That is, in the electronic device 500 according to this comparative example, a thickness $tx_1$ of the electronic component 511 is larger than a thickness $tx_2$ of the electronic component 512, and a height $ty_1$ of the bump 521 bonded to the electronic component 511 is the same as a height $ty_2$ of the bump 522 bonded to the electronic component 512. In this case, in the electronic device 500, as shown in FIG. 1B, the difference in height between the upper surface of the sealing member 13 above the electronic component 511 and the upper surface of the sealing member 13 above the electronic component 512 is td500, and an inclination angle of an inclined surface generated by both the upper surfaces is θ500.

In contrast, as shown in FIG. 1A, in the electronic device 1 according to this preferred embodiment, the height $ty_2$ of the bump 22 of the electronic component 12 with the small thickness is larger than the height $ty_1$ of the bump 21 of the electronic component 11, and hence the difference in mount height between the two electronic components (($tx_1+ty_1$)−($tx_2+ty_2$)) is able to be smaller than the difference in thickness between the two electronic components ($tx_1-tx_2$). Accordingly, a difference td1 in height between the upper surface of the sealing member 13 above the electronic component 11 and the upper surface of the sealing member 13 above the electronic component 12 is able to be smaller than td500. Also, an inclination angle θ1 of the upper surface of the sealing member in the electronic device 1 according to this preferred embodiment is able to be smaller than an inclination angle θ500 of the upper surface of the sealing member 13 in the electronic device 500 according to the comparative example.

In other words, the sealing space above the electronic component 12 is able to be smaller than that of the comparative example, and hence, the difference in volume between that sealing space and the sealing space above the electronic component 11 is able to be decreased.

Accordingly, with the above-described configuration of the electronic device 1 according to this preferred embodiment, the upper surface of the sealing member of the electronic device 1 is able to be more flat as compared with the configuration of related art including the bumps with the same height. Accordingly, CSP products, which have good flatness, and in which (1) in the dicing step (the cutting step with the dicing machine) after sealing, uniform cutting is provided, and hence production of a defective product is significantly reduced or prevented, (2) when a product is picked up using the upper surface of the sealing member by sucking etc., a failure in picking up a product using the upper surface is significantly reduced or prevented, and (3) a failure in recognizing a mark stamped on the upper surface of the sealing member is decreased, is able to be manufactured.

In this preferred embodiment, as a condition that makes the mount height of the electronic component 12 ($tx_2+ty_2$) close to the mount height of the electronic component 11 ($tx_1+ty_1$), the upper limit for the height of the bump 22 of the electronic component 12 with the small thickness may be determined by Expression (2) obtained by developing Expression (1) as follows.

$$(tx_2+ty_2)-(tx_1+ty_1)<(tx_1-tx_2) \quad (1)$$

$$ty_2<2(tx_1-tx_2)+ty_1 \quad (2)$$

Expression (1) considers a case where the mount height of the electronic component 12 ($tx_2+ty_2$) exceeds the mount height of the electronic component 11 ($tx_1+ty_1$). In this case, the difference in mount height between the electronic component and the electronic component 11 is required to be smaller than the difference in thickness between the electronic component 11 and the electronic component 12 as a condition.

Also, the height of the electronic component 11 from the principal surface 10a may be preferably aligned with the height of the electronic component 12 from the principal surface 10a. Accordingly, the upper surface of the sealing member of the electronic device 1 is able to be completely flat. A defective product in the dicing step (the cutting step with the dicing machine) after sealing, a failure in picking up a product using the upper surface, and a failure in stamping a mark on the upper surface are further decreased or prevented.

The situation in which the height of the electronic component 11 from the principal surface 10a is aligned with the height of the electronic component 12 from the principal surface 10a is defined as a situation in which the difference between the height of the electronic component 11 and the height of the electronic component 12 (($tx_1+ty_1$)−($tx_2+ty_2$)) is about 20% or less with respect to the height of the electronic component 11 ($tx_1+ty_1$), for example.

Also, the bump 21 bonded to the electronic component 11 and the bump 22 bonded to the electronic component 12 may be preferably configured of the same material. Accordingly, as compared with a case where different materials are used for the bump 21 and the bump 22, the difference in height between the bumps is able to be controlled in a simple step. The situation in which the bumps are configured of the same material represents that at least main metal elements configuring the bumps are the same, and is not limited to that the component ratios of the elements configuring the bumps are completely the same.

Figure 2:
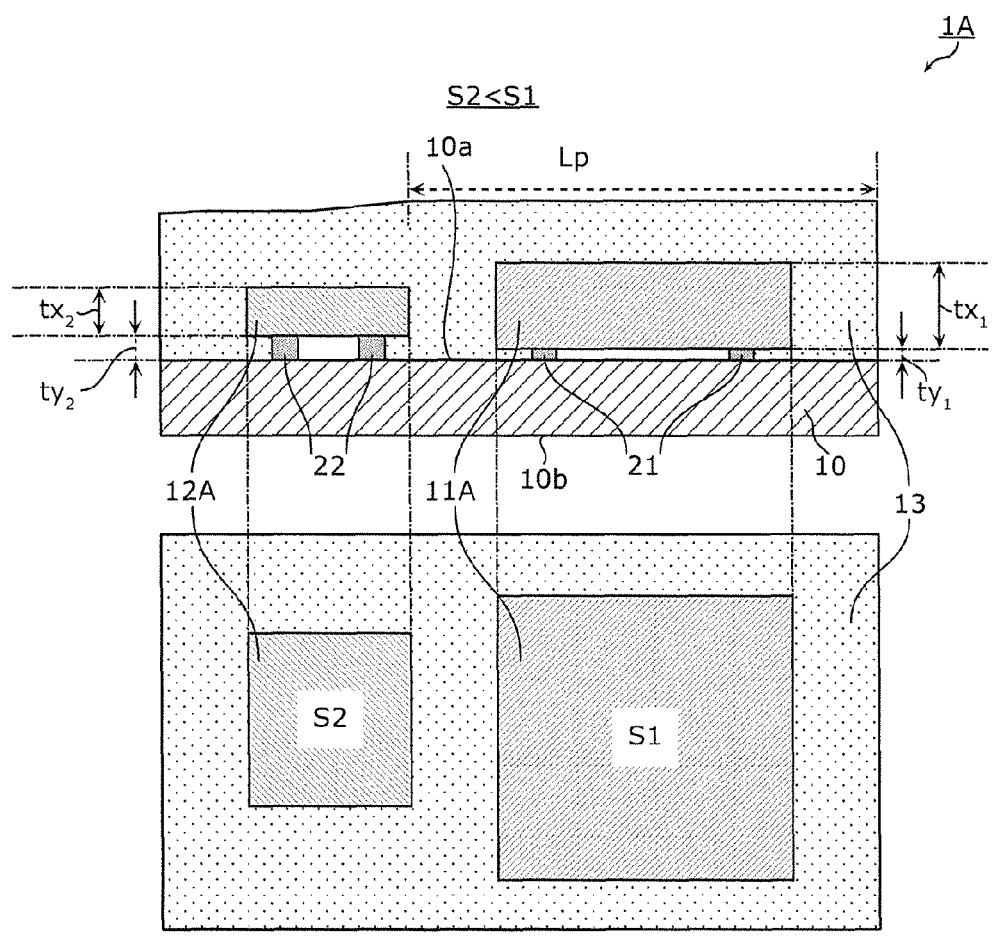
FIG. 2 provides an upper-surface perspective view and a cross-sectional view of an electronic device according to a first modification of the first preferred embodiment of the present invention.

FIG. 2 provides an upper-surface perspective view and a cross-sectional view of an electronic device 1A according to a first modification of the first preferred embodiment. The electronic device 1A according to this modification differs from the electronic device 1 according to the first preferred embodiment as a configuration in that the relationship between chip areas of electronic components 11A and 12A is determined. Hereinafter, the description for the same point as that of the electronic device 1 according to the first preferred embodiment is omitted, and the different point is mainly described.

In the electronic device 1A according to this modification, a thickness $tx_1$ of the electronic component 11A is larger than a thickness $tx_2$ of the electronic component 12A, and a height $ty_1$ of the bump 21 bonded to the electronic component 11A is smaller than a height $ty_2$ of the bump 22 bonded to the electronic component 12A. Also, a mount height of the electronic component 11A ($tx_1+ty_1$) is larger than a mount height of the electronic component 12A ($tx_2+ty_2$). Further, in plan view of the mount board 10, an area S1 of the electronic component 11A with the large mount height is larger than an area S2 of the electronic component 12A with the small mount height.

Accordingly, the area of the flat upper surface of the sealing member 13 above the electronic component with the large mount height (in FIG. 2, illustrated as a flat distance Lp) is able to be further increased. Accordingly, the accuracy of stamping a mark on the upper surface of the sealing member after sealing, and the accuracy of recognizing the stamped mark is able to be increased. Accordingly, the manufacturing steps of the electronic device 1A are simplified and the yield is increased.

Figure 3:
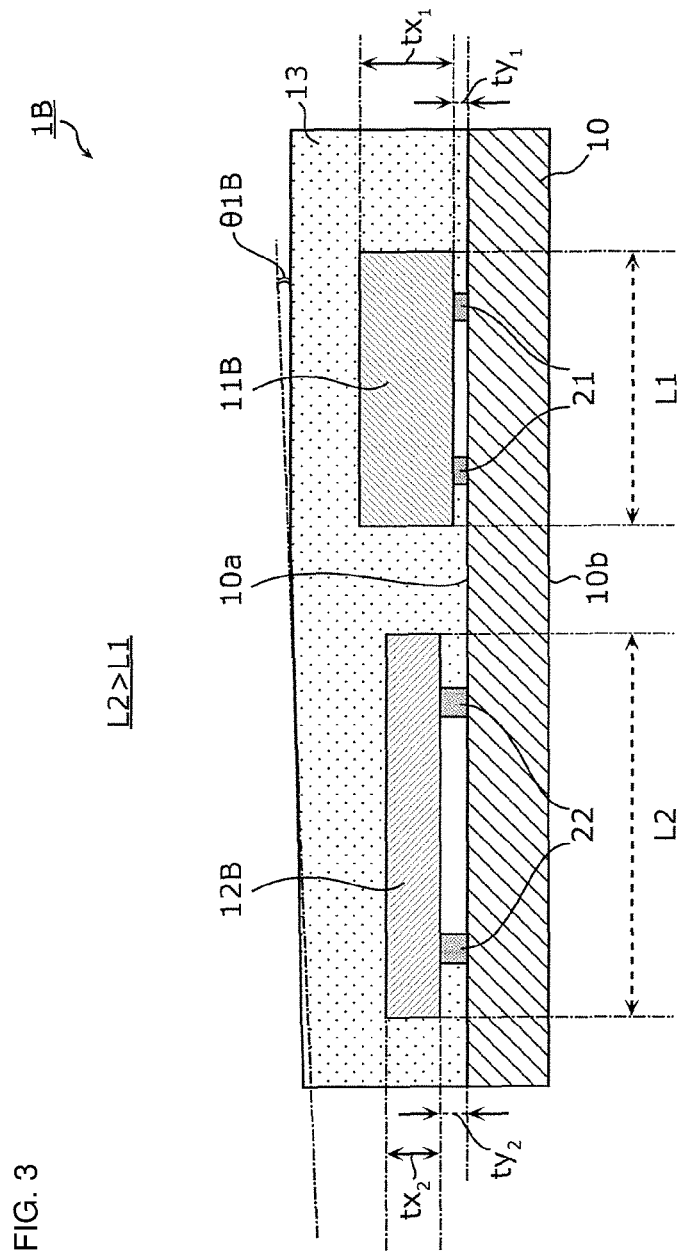
FIG. 3 is a cross-sectional view of an electronic device according to a second modification of the first preferred embodiment of the present invention.

FIG. 3 is a cross-sectional view of an electronic device 1B according to a second modification of the first preferred embodiment. The electronic device 1B according to this modification differs from the electronic device 1 according to the first preferred embodiment as a configuration in that the relationship between lengths of electronic components 11B and 12B, in an arrangement direction in which the electronic components 11B and 12B are arranged, is determined. Hereinafter, the description for the same point as that of the electronic device 1 according to the first preferred embodiment is omitted, and the different point is mainly described.

In the electronic device 1B according to this modification, a thickness $tx_1$ of the electronic component 11B is larger than a thickness $tx_2$ of the electronic component 12B, and a height $ty_1$ of the bump 21 bonded to the electronic component 11B is smaller than a height $ty_2$ of the bump 22 bonded to the electronic component 12B. Also, a mount height of the electronic component 11B ($tx_1+ty_1$) is larger than a mount height of the electronic component 12B ($tx_2+ty_2$). Further, a length L2, in the arrangement direction of the electronic components 11B and 12B, of the electronic component 12B with the small mount height is larger than a length L1 in the arrangement direction of the electronic component 11B with the large mount height.

With this configuration, an inclination (in FIG. 3, illustrated as inclination angle θ1B) generated between the upper surface of the sealing member 13 above the electronic component 11B and the upper surface of the sealing member 13 above the electronic component 12B is able to be decreased. Accordingly, the bonding area when the dicing sheet and the upper surface are bonded in the dicing step (the cutting step with the dicing machine) after sealing is able to be further increased, and hence the cutting accuracy is increased, the manufacturing steps of the electronic device are simplified, and the yield is increased.

Figure 4:
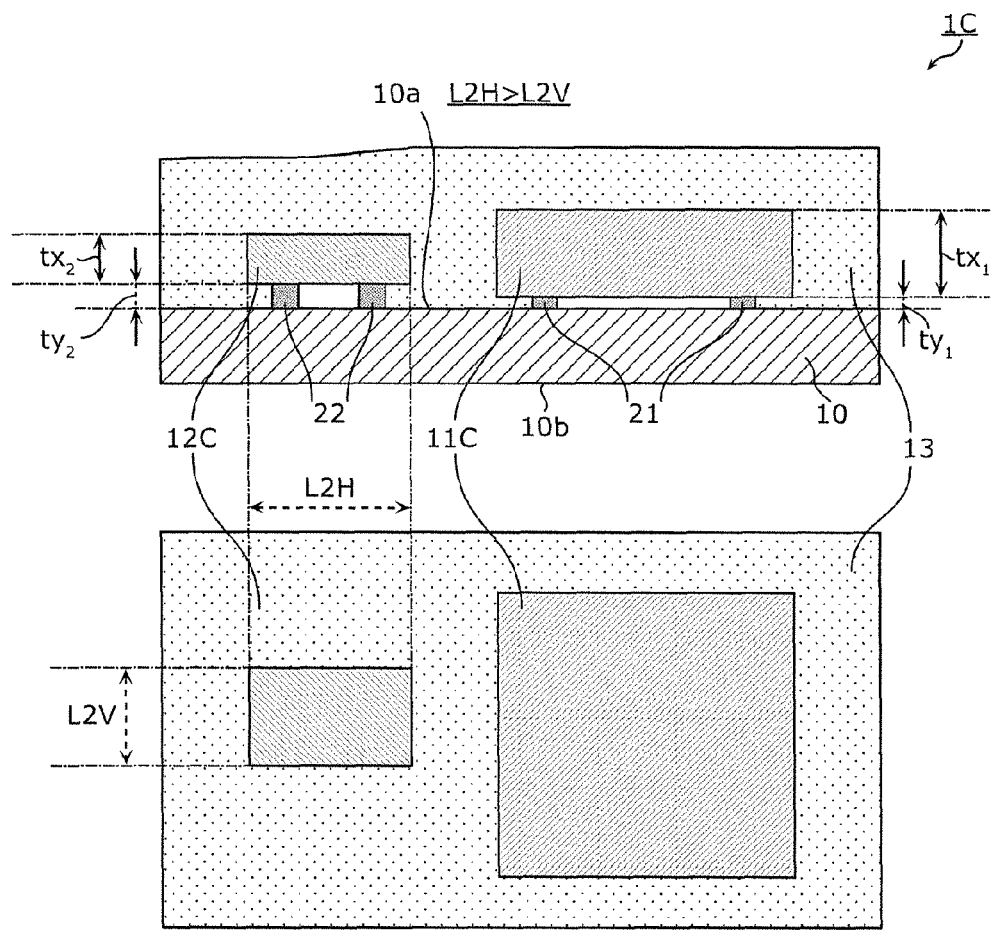
FIG. 4 provides an upper-surface perspective view and a cross-sectional view of an electronic device according to a third modification of the first embodiment of the present invention.

FIG. 4 provides an upper-surface perspective view and a cross-sectional view of an electronic device 1C according to a third modification of the first preferred embodiment. The electronic device 1C according to this modification differs from the electronic device 1 according to the first preferred embodiment as a configuration in that arrangement directions of the short side and the long side of an electronic component 12C are determined. Hereinafter, the description for the same point as that of the electronic device 1 according to the first preferred embodiment is omitted, and the different point is mainly described.

In the electronic device 1C according to this modification, a thickness $tx_1$ of the electronic component 11C is larger than a thickness $tx_2$ of the electronic component 12C, and a height $ty_1$ of the bump 21 bonded to the electronic component 11C is smaller than a height $ty_2$ of the bump 22 bonded to the electronic component 12C. Also, a mount height of the electronic component 11C ($tx_1+ty_1$) is larger than a mount height of the electronic component 12C ($tx_2+ty_2$). Further, in plan view of the mount board 10, a length L2H, in an arrangement direction in which the electronic components 11C and 12C are arranged, of the electronic component 12C with the small mount height is larger than a length L2V in a direction intersecting with the arrangement direction of the electronic component 12C with the small mount height.

With this configuration, a distance in the arrangement direction on the upper surface of the sealing member 13 above the electronic component with the small mount height is able to be provided. An inclination generated between the upper surface of the sealing member 13 above the electronic component 11C and the upper surface of the sealing member 13 above the electronic component 12C is able to be further decreased. Accordingly, the bonding area when the dicing sheet and the upper surface are bonded in the dicing step (the cutting step with the dicing machine) after sealing is able to be further increased, and hence the cutting accuracy is increased, the manufacturing steps of the electronic device are simplified, and the yield is increased.

In the second and third modifications, the example of the electronic component with a rectangular or substantially rectangular shape in plan view has been described. However, the shape of the electronic component according to this modification is not limited thereto. The length of an electronic component in a predetermined direction can be defined as a length (width) of the electronic component projected in cross-sectional view of the electronic component in a direction perpendicular to the predetermined direction.

A non-limiting example of a manufacturing method of the electronic device according to a preferred embodiment of the present invention is described with reference to FIGS. 5A-5D.

FIGS. 5A-5D are process cross-sectional views illustrating a method of manufacturing the electronic device 1 according to the first preferred embodiment. FIGS. 5A-5D are cross-sectional views of a workpiece in steps from a state where the bumps 21 and 22 are respectively bonded to the electronic components 11 and 12, to a state where a diced electronic device 1 is manufactured.

Figure 5:
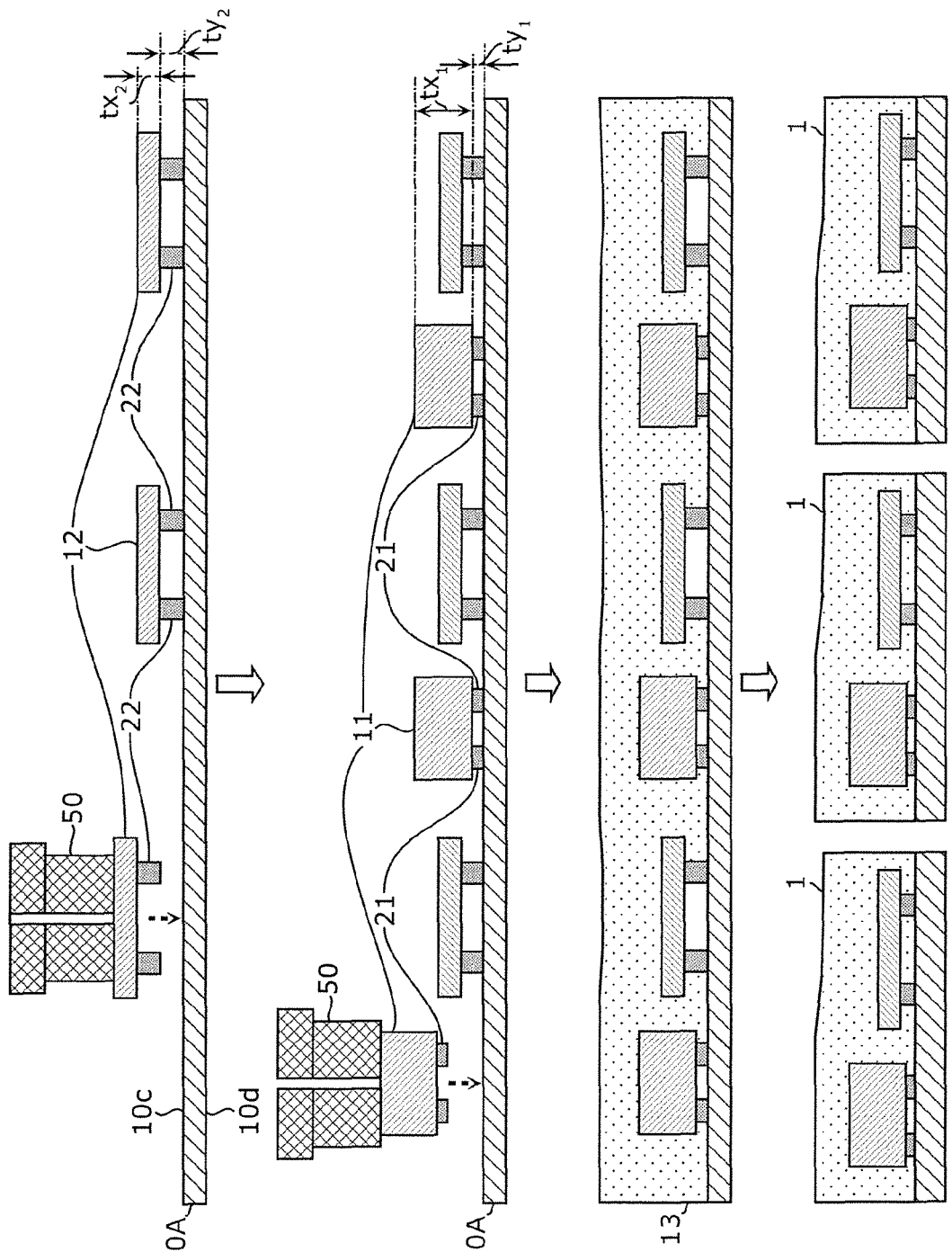
FIGS. 5A-5D are process cross-sectional views explaining a method of manufacturing the electronic device according to the first preferred embodiment of the present invention.

First, before the step shown in FIG. 5A, the bumps 21 and 22 containing Au as a main component are formed on electrode pads of the electronic components 11 and 12 by ball bonding (bump bonding step). To be more specific, in a previous phase before the electronic component 11 or 12 is diced, that is, in a phase in which the electronic component 11 or 12 is formed in a state of a collective board, the bumps 21 and 22 are formed on electrode pads of the collective board by ball bonding. Then, for example, the collective board to which the bump 21 or 22 is bonded is diced by cutting with a dicing machine, and hence the electronic components 11 and 12 to which the bump 21 or 22 is bonded are formed. Bump bonding in this step may be executed in the state of the collective board as described above, or may be executed for each of the diced electronic components 11 and 12.

Then, as shown in FIG. 5A, in the electronic component 12 to which the bump 22 is bonded, the second principal surface to which the bump 22 is not bonded is sucked via a vacuum suction hole of a bonding tool 50. Then, the first principal surface to which the bump 22 is bonded is placed to face an element mount surface 10c of a collective mount board 10A, and the bump 22 is bonded to the electrode land of the collective mount board 10A by flip-chip bonding (first flip-chip bonding step). In this flip-chip bonding, supersonic waves and heat are simultaneously applied from the bonding tool 50, and hence the bump 22 is bonded to the electrode land of the collective mount board 10A. Flip-chip bonding in this step is not limited to a method of simultaneously applying the supersonic waves and heat, and may be a method of applying only one of the supersonic waves and heat, or a method of applying supersonic waves and heat with a time delay.

Next, as shown in FIG. 5B, in the electronic component 11 to which the bump 21 is bonded, the bump 21 is bonded to the electrode land of the collective mount board 10A by the same method as the above-described flip-chip bonding (second flip-chip bonding step).

The thickness $tx_1$ of the electronic component 11 is larger than the thickness $tx_2$ of the electronic component 12. In this case, in the electronic device 1 according to this preferred embodiment, the bump bonding step and the first and second flip-chip bonding steps are executed so that the height of the bump 21 is smaller than the height of the bump 22 after the flip-chip bonding.

A method of setting the height of the bump 21 to be smaller the height of the bump 22 after the flip-chip bonding may be, for example, (1) setting the amount of the bump 21 to be smaller than the amount of the bump 22 in the bump bonding step, (2) bonding the bump 21 to be lower than the bump 22 in the direction of the normal to the bonding surface of the electronic component, (3) differentiating the application condition of the supersonic waves and heat between the first flip-chip bonding step and the second flip-chip bonding step, and (4) combining at least two of the above-described methods (1) to (3).

Next, as shown in FIG. 5C, the electronic components 11 and 12 mounted on the collective mount board 10A are sealed (sealing step). To be more specific, sealing with resin including, for example, laminating a film made of epoxy resin on the electronic components 11 and 12, further arranging thermosetting epoxy resin containing an inorganic filler such as $SiO_2$, and applying heat and pressure, is executed. Accordingly, the second principal surfaces of the electronic components 11 and 12 and the element mount surface 10c of the collective mount board 10A are in close contact with the sealing member 13, and hence the spaces on the first principal surfaces of the electronic components 11 and 12 are hermetically sealed.

Finally, as shown in FIG. 5D, the collective mount board 10A having mounted thereon the electronic components 11 and 12 is diced as a set of the electronic components 11 and 12 (dicing step). This dicing step is, for example, cutting with a dicing machine. Accordingly, the diced electronic device 1 is completed.

With the above-described manufacturing method, the height $ty_2$ of the bump 22 of the electronic component 12 with the small thickness is larger than the height $ty_1$ of the bump 21 of the electronic component 11, and hence the difference in height between the upper surface of the sealing member 13 above the electronic component 11 and the upper surface of the sealing member 13 above the electronic component 12 is able to be decreased. That is, the mount height of the electronic component 12 ($tx_2+ty_2$) is able to be made close to the mount height of the electronic component 11 ($tx_1+ty_1$). Accordingly, since the flatness of the upper surface of the electronic device 1 is improved, CSP products, in which a defective product in the dicing step after sealing, a failure in picking up a product using the upper surface, and a failure in recognizing a mark stamped on the upper surface are decreased, are able to be manufactured.

The first flip-chip bonding and the second flip-chip bonding may be preferably executed in the order from a component with a small mount height (the sum of the thickness of an electronic component and the height of a bump). In the second flip-chip bonding step, there may be expected a case where the suction area of the bonding tool 50 is larger than the area of the electronic component 11, or a case where bonding is executed while the bonding tool 50 is horizontally shifted toward the electronic component 12. Even in this case, according to this preferred embodiment, the mount height of the electronic component 11 ($tx_1+ty_1$) is larger than the mount height of the electronic component 12 ($tx_2+ty_2$), and hence the bonding tool 50 is able to be prevented from interfering with the electronic component 12 even if the bonding tool 50 is shifted toward the electronic component 12. Hence, the distance between the electronic components 11 and 12 is able to be decreased, and the size of the electronic device 1 is able to be decreased. Also, in this case, there is not required to use a bonding tool 50 with a smaller suction surface at its distal end than the electronic component 11. Accordingly, the supersonic waves and heat is able to be efficiently transmitted to the bumps 21 and 22, and bondability is increased.

Also, in the above-described manufacturing method, the step of previously bonding the bumps 21 and 22 to the electronic components 11 and 12 has been described; however, the bumps 21 and 22 may be previously bonded to the element mount surface 10c of the collective mount board 10A.

Second Preferred Embodiment

In a second preferred embodiment of the present invention, an example of applying the electronic device 1 according to the first preferred embodiment to a surface acoustic wave (SAW) device is described. Hereinafter, the same reference sign is applied to the same component as that in the electronic device 1 according to the first preferred embodiment, and a feature different from the electronic device 1 is mainly described.

Figure 6:
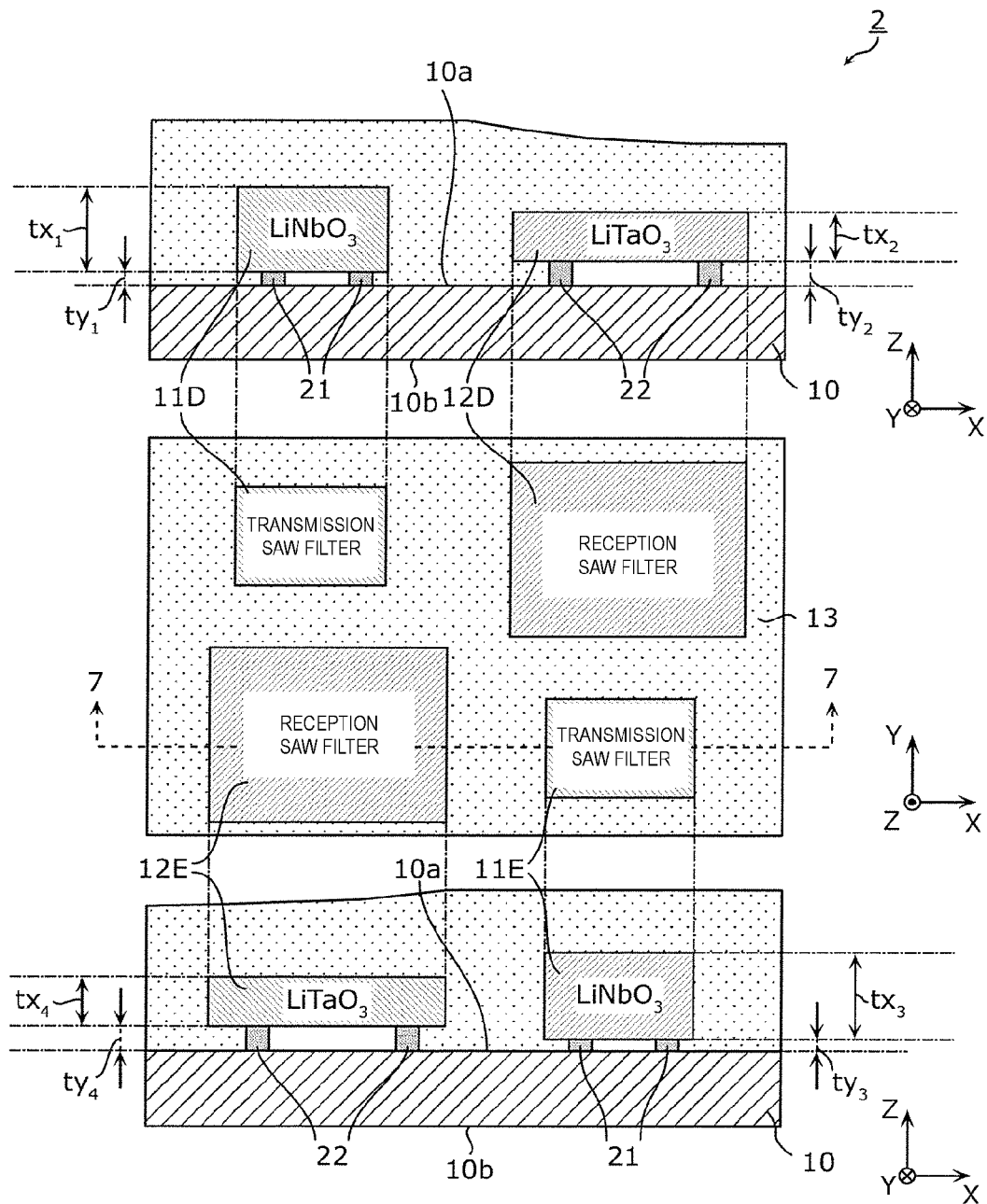
FIG. 6 provides an upper-surface perspective view and cross-sectional views of an electronic device according to a second preferred embodiment of the present invention.

FIG. 6 provides an upper-surface perspective view and cross-sectional views of an electronic device 2 according to a second preferred embodiment. The electronic device 2 shown in FIG. 6 includes a mount board 10, transmission SAW filters 11D and 11E, reception SAW filters 12D and 12E, bumps 21 and 22, and a sealing member 13. As shown in FIG. 6, the transmission SAW filter 11D and the reception SAW filter 12D are arranged next to one another in the X-axis direction, and the transmission SAW filter 11E and the reception SAW filter 12E are arranged next to one another in the X-axis direction, on the mount board 10. Also, the transmission SAW filter 11D and the reception SAW filter 12E are arranged next to one another in the Y-axis direction, and the transmission SAW filter 11E and the reception SAW filter 12D are arranged next to one another in the Y-axis direction.

The transmission SAW filter 11D and the reception SAW filter 12D define, for example, a first SAW duplexer that selectively passes a transmission signal and a reception signal in a first frequency band. Also, the transmission SAW filter 11E and the reception SAW filter 12E define, for example, a second SAW duplexer that selectively passes a transmission signal and a reception signal in a second frequency band. The electronic device 2 defines, for example, a dual duplexer including the first SAW duplexer and the second SAW duplexer, or a quadplexer including four SAW filter elements.

In the electronic device 2 according to this preferred embodiment, a thickness $tx_1$ of the transmission SAW filter 11D is larger than a thickness $tx_2$ of the reception SAW filter 12D, and a height $ty_1$ of the bump 21 bonded to the transmission SAW filter 11D is smaller than a height $ty_2$ of the bump 22 bonded to the reception SAW filter 12D.

Also, a thickness $tx_3$ of the transmission SAW filter 11E is larger than a thickness $tx_4$ of the reception SAW filter 12E, and a height $ty_3$ of the bump 21 bonded to the transmission SAW filter 11E is smaller than a height $ty_4$ of the bump 22 bonded to the reception SAW filter 12E.

A structure of the electronic device 2 is described below in detail with reference to FIG. 7.

Figure 7:
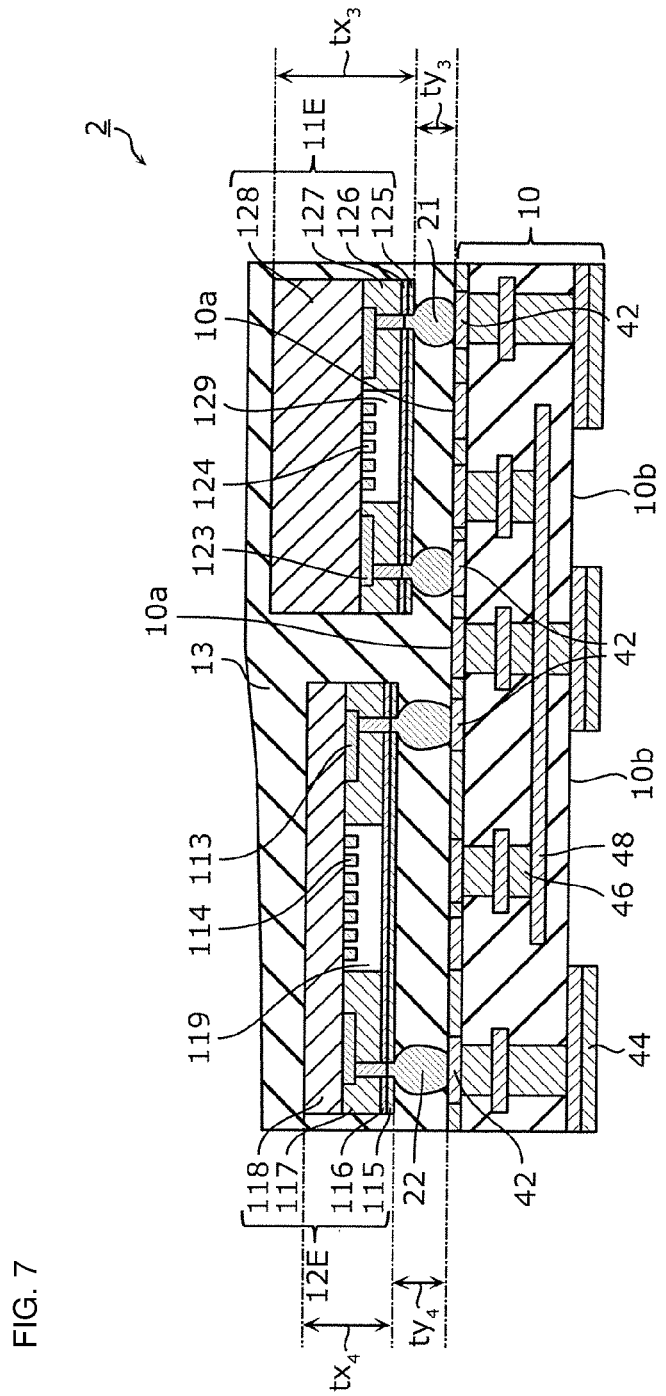
FIG. 7 is a cross-sectional view showing a specific configuration of the electronic device according to the second preferred embodiment of the present invention.

FIG. 7 is a cross-sectional view showing a specific configuration of the electronic device 2 according to the second preferred embodiment. FIG. 7 is a cross-sectional view taken along line 7-7 in the upper perspective view of the electronic device 2 shown in FIG. 6. As shown in FIG. 7, the transmission SAW filter 11E and the reception SAW filter 12E are flip-chip mounted on the mount board 10.

The transmission SAW filter 11E includes an IDT electrode 124, a pad 123, a piezoelectric substrate 128, a support layer 127, a cover layer 126, and a protection layer 125. A conductive pattern is provided on one of principal surfaces of the piezoelectric substrate 128. The conductive pattern includes the IDT electrode 124, the pad 123, and wiring (not shown) to couple the IDT electrode 124 with the pad 123. The support layer 127 preferably has a frame-shaped structure around a hollow 129 in which the IDT electrode 124 is provided. The thickness of the support layer 127 is larger than the thickness of the conductive pattern of the IDT electrode 124 etc.

The support layer 127 is configured of, for example, a material containing at least one of polyimide, epoxy, benzocyclobutene (BCB), polybenzoxazole (PBO), metal, and silicon oxide.

The piezoelectric substrate 128 is a substrate configured of single-crystal $LiNbO_3$. Also, the IDT electrode 124 is a substantially comb-shaped electrode containing Cu as a main material. Although not shown, a piezoelectric substrate of the transmission SAW filter 11D is configured of, for example, single-crystal $LiNbO_3$, and an IDT electrode is a substantially comb-shaped electrode containing Pt as a main material.

The hollow 129 is sealed by the cover layer 126 and the protection layer 125. The sealing by the cover layer 126 and the protection layer 125 is not necessarily hermetical sealing, and is only required to be liquid-tight.

The cover layer 126 is configured of, for example, a material containing at least one of epoxy, urethane, phenol, polyester, BCB, PBO, $LiTaO_3$, and $LiNbO_3$.

The protection layer 125 is configured of, for example, a material containing at least one of polyimide, epoxy, BCB, PBO, silicon, and silicon oxide.

The protection layer 125, the cover layer 126, and the support layer 127 have a via hole (through hole) reaching to the pad 123 provided on one of the principal surfaces of the piezoelectric substrate 128. The via hole is filled with under bump metal as a via conductor. A bump 21 is provided on the under bump metal. The bump 21 is exposed to the outside.

The reception SAW filter 12E includes an IDT electrode 114, a pad 113, a piezoelectric substrate 118, a support layer 117, a cover layer 116, and a protection layer 115. A conductive pattern is provided on one of principal surfaces of the piezoelectric substrate 118. The conductive pattern includes the IDT electrode 114, the pad 113, and wiring (not shown) to couple the IDT electrode 114 with the pad 113. The support layer 117 preferably has a frame-shaped structure around a hollow 119 in which the IDT electrode 114 is provided. The thickness of the support layer 117 is larger than the thickness of the conductive pattern of the IDT electrode 114 etc.

The piezoelectric substrate 118 is a substrate configured of single-crystal $LiTaO_3$. Also, the IDT electrode 114 is a substantially comb-shaped electrode containing Al as a main material. Although not shown, a piezoelectric substrate of the reception SAW filter 12D is configured of, for example, single-crystal $LiTaO_3$, and an IDT electrode is a substantially comb-shaped electrode containing Al as a main material. The configurations of the hollow 119, the cover layer 116, and the protection layer 115 are the same as the configurations of the hollow 129, the cover layer 126, and the protection layer 125, and hence the description is omitted.

The protection layer 125 and the protection layer 115 are not essential components of the transmission SAW filter 11E and the reception SAW filter 12E.

The thicknesses of the piezoelectric substrate of the reception SAW filter 12D and the piezoelectric substrate 118 of the reception SAW filter 12E each preferably are, for example, about 130 μm, and the thicknesses of the piezoelectric substrate of the transmission SAW filter 11D and the piezoelectric substrate 128 of the transmission SAW filter 11E each preferably are, for example, about 200 μm. Also, the thickness including the support layer, the cover layer, and the protection layer (hereinafter, called h) of the reception SAW filter is substantially the same as that of the transmission SAW filter.

The thickness of a SAW filter according to this preferred embodiment is defined as a distance from the bottom surface to the upper surface in the direction of the normal to a principal surface 10a of a SAW filter excluding a bump. For example, the bottom surface of the reception SAW filter 12E is a surface bonded to a bump of the cover layer 116, and the upper surface is a back surface of the piezoelectric substrate 118 (on which the IDT electrode 114 is not provided).

That is, the thicknesses of the transmission SAW filters 11D and 11E in the direction of the normal to the principal surface 10a are larger than the thicknesses of the reception SAW filters 12D and 12E in the normal direction. Based on the relationship in thickness, the initial bump size and supersonic wave condition during flip-chip are adjusted so that the height of the bumps 22 of the reception SAW filters 12D and 12E preferably is about 25 μm, and the height of the bumps 21 of the transmission SAW filters 11D and 11E preferably is about 9 μm, for example. That is, the height in the normal direction of the bumps 21 bonded to the transmission SAW filters 11D and 11E is smaller than the height in the normal direction of the bumps 22 bonded to the reception SAW filters 12D and 12E.

The sealing member 13 is arranged around the transmission SAW filters 11D and 11E, and the reception SAW filters 12D and 12E in a close contact manner. The SAW filters are covered with the sealing member 13.

An outer coupling electrode 44 to mount the electronic device 2 on other circuit board or the like is exposed at the other principal surface 10b side of the mount board 10. A board via conductor 46 and an inner wiring pattern 48 that electrically couple a land 42 with the outer coupling electrode 44 are provided in the mount board 10.

With the configuration of the electronic device 2 according to this preferred embodiment, the height of the bump (for example, about 25 μm) of the reception SAW filter with the small thickness is larger than the height of the bump 21 (for example, about 9 μm) of the transmission SAW filter, and hence the difference (for example, about (209 μm+h)−(155 μm+h)=54 μm) between the height of the upper surface of the sealing member 13 above the transmission SAW filter from the principal surface 10a (for example, about 200 μm+h+9 μm=209 μm+h) and the height of the upper surface of the sealing member 13 above the reception SAW filter from the principal surface 10a (for example, about 130 μm+h+25 μm=155 μm+h) is able to be smaller than the difference in thickness between the transmission SAW filter and the reception SAW filter (for example, about (200 μm+h)−(130 μm+h)=70 μm). That is, the mount height of the reception SAW filter can be made close to the mount height of the transmission SAW filter as compared with the difference in thickness between the transmission SAW filter and the reception SAW filter. Accordingly, since the flatness of the upper surface of the electronic device 2 is improved, CSP products, in which a defective product in the dicing step after sealing, a failure in picking up a product using the upper surface, and a failure in recognizing a mark stamped on the upper surface are decreased or prevented, are able to be manufactured. Hence, the manufacturing steps are simplified, a small-size and small-height complex SAW device is able to be provided, and, for example, a small-size and small-height CSP dual duplexer or quadplexer with good flatness is able to be provided.

The order of flip-chip bonding may be preferably bonding the reception SAW filters 12D and 12E first, and then bonding the transmission SAW filters 11D and 11E later. This is because the electronic component with the small mount height (the sum of the thickness of the electronic component and the height of the bump) may be preferably bonded first, also as described in the first preferred embodiment.

Third Preferred Embodiment

In the second preferred embodiment, the example has been described, in which the configuration of the electronic device 1 according to the first preferred embodiment is applied to the electronic device including the plurality of passive electronic components such as filter elements. In contrast, in this preferred embodiment, an example is described, in which the configuration of the electronic device 1 according to the first preferred embodiment is applied to an electronic device including a passive electronic component such as a filter element and an active electronic component such as an amplifier element. Hereinafter, the same reference sign is applied to the same component as that in the electronic device 2 according to the second preferred embodiment, and a feature different from the electronic device 2 is mainly described.

Figure 8:
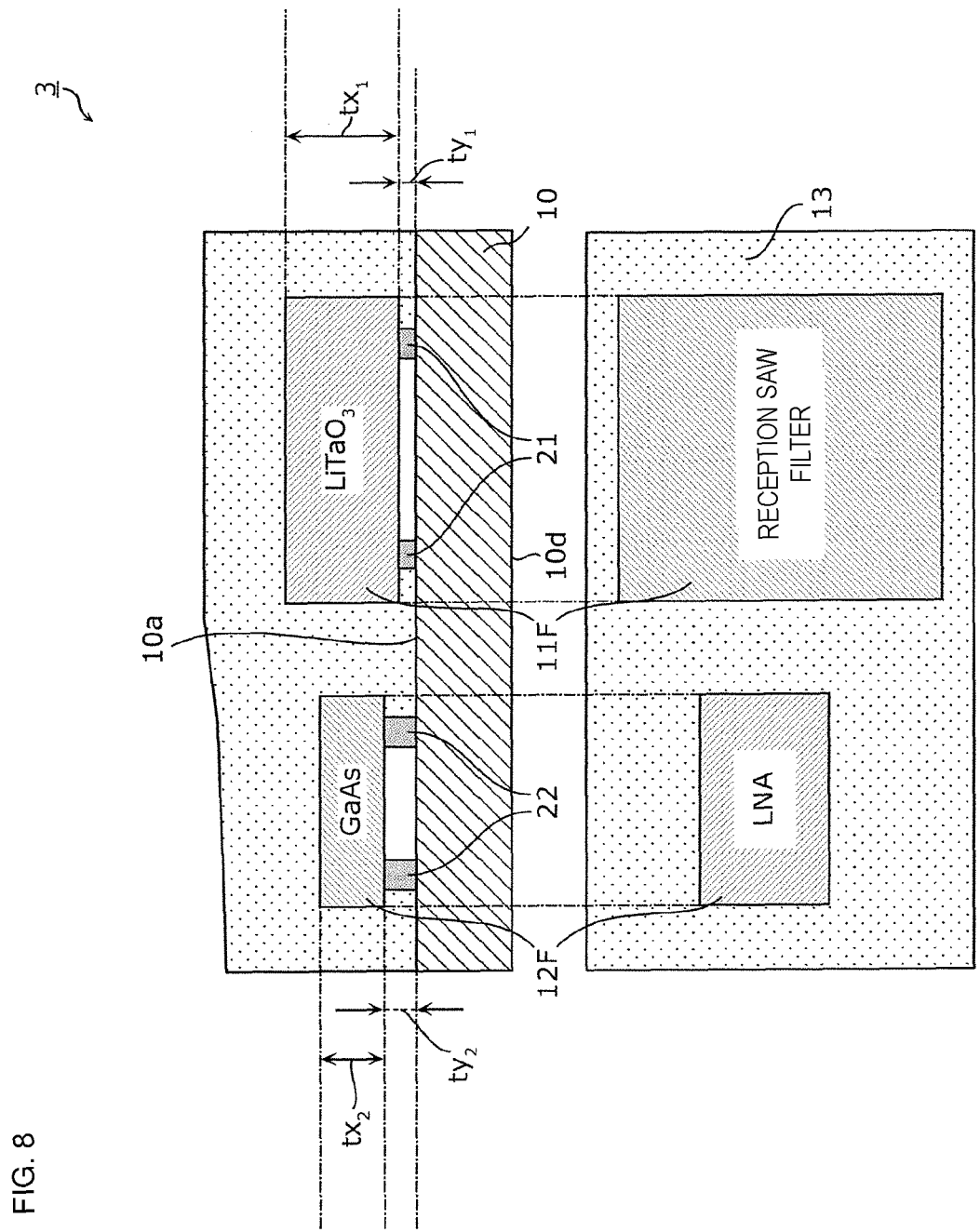
FIG. 8 provides an upper-surface perspective view and a cross-sectional view of an electronic device according to a third preferred embodiment of the present invention.
Figure 9:
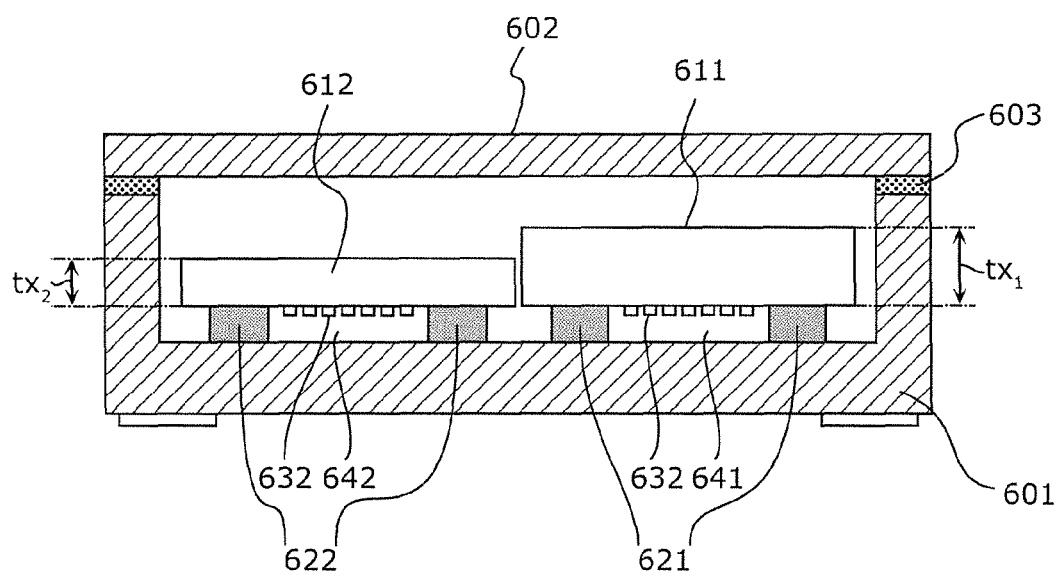
FIG. 9 is a cross-sectional view of an electronic device disclosed in Japanese Unexamined Patent Application Publication No. 2001-257236.

FIG. 8 provides an upper-surface perspective view and a cross-sectional view of an electronic device 3 according to a third preferred embodiment of the present invention. The electronic device 3 illustrated in FIG. 8 includes a mount board 10, a reception SAW filter 11F, a low noise amplifier 12F, bumps 21 and 22, and a sealing member 13. As shown in FIG. 8, the reception SAW filter 11F and the low noise amplifier 12F are arranged next to each other on the mount board 10.

The reception SAW filter 11F is, for example, a high-frequency filter element that selectively passes a reception signal in a predetermined frequency band. Also, the low noise amplifier 12F is an amplifier element that amplifies the reception signal passing through the reception SAW filter 11F. The reception SAW filter 11F and the low noise amplifier 12F define a reception-side module that selectively passes a reception signal received by an antenna element and transfers the reception signal to a radio frequency integrated circuit (RFIC).

In the electronic device 3 according to this preferred embodiment, a thickness $tx_1$ of the reception SAW filter 11F is larger than a thickness $tx_2$ of the low noise amplifier 12F, and a height $ty_1$ of the bump 21 bonded to the reception SAW filter 11F is smaller than a height $ty_2$ of the bump 22 bonded to the low noise amplifier 12F.

As shown in FIG. 8, the reception SAW filter 11F and the low noise amplifier 12F are flip-chip mounted on the mount board 10. The detailed configuration of the reception SAW filter 11F is the same as, for example, the reception SAW filter 12E according to the second preferred embodiment, and hence the description is omitted.

The low noise amplifier 12F is, for example, an amplifier element configured of a GaAs substrate. Alternatively, the low noise amplifier 12F may include a Si substrate.

The thickness of the reception SAW filter 11F in the direction of the normal to a principal surface 10a is, for example, about 200 μm, and the thickness of the low noise amplifier 12F in the normal direction is, for example, about 140 μm.

That is, the thickness of the reception SAW filter 11F is larger than the thickness of the low noise amplifier 12F. Based on this relationship in thickness, the initial bump size and the supersonic wave condition during flip-chip are adjusted so that the height of the bump 21 of the reception SAW filter 11F is about 10 μm, and the height of the bump 22 of the low noise amplifier 12F is about 30 μm, for example.

The sealing member 13 is arranged around the reception SAW filter 11F and the low noise amplifier 12F in a close contact manner. The reception SAW filter 11F and the low noise amplifier 12F are covered with the sealing member 13.

With the configuration of the electronic device 3 according to this preferred embodiment, the height of the bump 22 (for example, about 30 μm) of the low noise amplifier 12F with the small thickness is larger than the height of the bump 21 (for example, about 10 μm) of the reception SAW filter 11F, and hence the difference (for example, about 210 μm−170 μm=40 μm) between the height of the upper surface of the sealing member 13 above the reception SAW filter 11F from the principal surface 10a (for example, about 200 μm+10 μm=210 μm) and the height of the upper surface of the sealing member 13 above the low noise amplifier 12F from the principal surface 10a (for example, about 140 μm+30 μm=170 μm) is able to be smaller than the difference in thickness between the reception SAW filter 11F and the low noise amplifier 12F (for example, about 200 μm−140 μm=60 μm). That is, the mount height of the low noise amplifier 12F can be made close to the mount height of the reception SAW filter 11F as compared with the difference in thickness between the reception SAW filter 11F and the low noise amplifier 12F.

Accordingly, since the flatness of the upper surface of the electronic device 3 is improved, CSP products, in which a defective product in the dicing step after sealing, a failure in picking up a product using the upper surface, and a failure in recognizing a mark stamped on the upper surface are decreased, can be manufactured. Hence, the manufacturing steps are simplified, a small-size and small-height high-frequency active device is able to be provided, and, for example, a small-size and small-height CSP reception-side module or transmission-side module with good flatness is able to be provided.

The order of flip-chip bonding may be preferably bonding the low noise amplifier 12F first, and bonding the reception SAW filter 11F later. This is because the electronic component with the small mount height (the sum of the thickness of the electronic component and the height of the bump) may be preferably bonded first, also as described in the first preferred embodiment.

Other Preferred Embodiments

The electronic device according to a preferred embodiment of the present invention has been described above with reference to the preferred embodiments and modifications; however, the electronic device of the present invention is not limited to the above-described preferred embodiments and modifications. Another preferred embodiment implemented by combining certain components in the preferred embodiments and modifications, a modification obtained by modifying the preferred embodiments and modifications in various ways conceivable by those skilled in the art within the scope of the present invention, and various devices including any of the disclosed electronic devices are included in the present invention.

For example, a preferred embodiment implemented by combining the feature or features of any of the electronic devices 1A to 1C according to the first to third modifications of the first preferred embodiment, with the electronic device 2 according to the second preferred embodiment or the electronic device 3 according to the third preferred embodiment is included in the present invention. For example, the thicknesses of the transmission SAW filters 11D and 11E according to the second preferred embodiment may be larger than the thicknesses of the reception SAW filters 12D and 12E, and in plan view of the mount board 10, the areas of the transmission SAW filters 11D and 11E with large mount heights may be larger than the areas of the reception SAW filters 12D and 12E with small mount heights.

Preferred embodiments of the present invention are able to be widely used as a small-size and small-height electronic device for a communication device such as a cellular phone.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
a mount board;
a first electronic component and a second electronic component flip-chip mounted on a surface of the mount board with bumps interposed therebetween; and
a sealing member that seals the first electronic component and the second electronic component on the mount board; wherein
a thickness of the first electronic component is larger than a thickness of the second electronic component; and
a height of the bump bonded to the first electronic component is smaller than a height of the bump bonded to the second electronic component.

2. The electronic device according to claim 1, wherein in plan view of the mount board, an area of one electronic component of the first electronic component and the second electronic component with a large height from the surface of the mount board is larger than an area of the other electronic component with a small height from the surface of the mount board.

3. The electronic device according to claim 1, wherein, a length, in an arrangement direction in which the first electronic component and the second electronic component are arranged, of one electronic component of the first electronic component and the second electronic component with a small height from the surface of the mount board is larger than a length in the arrangement direction of the other electronic component with a large height from the surface of the mount board.

4. The electronic device according to claim 1, wherein, in the plan view of the mount board, a length, in an arrangement direction in which the first electronic component and the second electronic component are arranged, of one electronic component of the first electronic component and the second electronic component with a small height from the surface of the mount board is larger than a length in a direction intersecting with the arrangement direction of the one electronic component with the small height from the surface of the mount board.

5. The electronic device according to claim 1, wherein a height of the first electronic component from the surface is aligned or substantially aligned with a height of the second electronic component from the surface.

6. The electronic device according to claim 1, wherein the bump bonded to the first electronic component and the bump bonded to the second electronic component are made of the same material.

7. The electronic device according to claim 1, wherein
the first electronic component is an elastic wave element; and
the second electronic component is an amplifier element.

8. The electronic device according to claim 1, wherein the first electronic component and the second electronic component are surface acoustic wave elements.

9. The electronic device according to claim 1, wherein the mount board is a printed circuit board or a ceramic substrate.

10. The electronic device according to claim 1, wherein the sealing member includes a resin.

11. The electronic device according to claim 1, wherein the sealing member includes a thermosetting epoxy resin including an inorganic filler.

12. The electronic device according to claim 1, wherein the bumps are defined by electrodes or metal material.

13. The electronic device according to claim 1, wherein a difference in mount height between the first and second electronic components is smaller than a difference in thickness between the first and second electronic components.

14. The electronic device according to claim 1, wherein a difference between a height of the first electronic component and a height of the second electronic component is about 20% or less with respect to the height of the first electronic component.

15. The electronic device according to claim 1, wherein the first and second electronic components have different lengths.

16. The electronic device according to claim 1, wherein the first and second electronic components have rectangular or substantially rectangular shapes.

17. The electronic device according to claim 1, wherein the first and second electronic components are surface acoustic wave filters.

18. The electronic device according to claim 1, wherein the first electronic component is a passive electronic component and the second electronic component is an active electronic component.

* * * * *